United States Patent [19]
Kattner et al.

[11] Patent Number: 6,133,782
[45] Date of Patent: Oct. 17, 2000

[54] INTEGRATOR-FILTER CIRCUIT

[75] Inventors: Axel Kattner, Seevetal; Holger Gehrt, Rosengarten, both of Germany

[73] Assignee: U.S. Philips Corporation, New York, N.Y.

[21] Appl. No.: 09/195,058

[22] Filed: Nov. 18, 1998

[30] Foreign Application Priority Data

Nov. 29, 1997 [DE] Germany ............................ 197 53 095

[51] Int. Cl.[7] .................................................. H03B 1/00
[52] U.S. Cl. ........................... 327/553; 327/341; 327/561
[58] Field of Search .................................... 327/552–559, 327/336, 341, 355, 356, 358, 560, 561, 563; 330/252, 254, 255, 262

[56] References Cited

U.S. PATENT DOCUMENTS

| | | | |
|---|---|---|---|
| 5,691,720 | 11/1997 | Wang et al. ............................ | 341/143 |
| 5,734,294 | 3/1998 | Bezzam et al. ......................... | 327/552 |
| 5,856,757 | 1/1999 | Eschauzier ............................. | 327/553 |

OTHER PUBLICATIONS

Philips Semiconductors–IC TDA 9715H/A Y/C Data Sheet, One chip–orocessor, Product specification, Oct. 21, 1996.

*Primary Examiner*—Timothy P. Callahan
*Assistant Examiner*—Minh Nguyen
*Attorney, Agent, or Firm*—Steven R. Biren

[57] ABSTRACT

To achieve a constant control range in an integrator-filter circuit for filtering a push-pull signal, having at least two integrator elements (1) this second control current being having resistors (11, 12) arranged at its inputs, a subsequent current multiplier (13) having two signal inputs (14, 15) and preceding a push-pull amplifier (18) with an inverting input (20) and a non-inverting input (19), having inverting output (21) fed back to the non-inverting input (19) and a non-inverting output (23) fed back to the inverting input (20) via capacitances (22, 24), the current multiplier (13) receiving, at two control inputs (37, 38), a first and a second control current ($I_1$, $I_2$) for adjusting the integration time constant of the integrator element (1) is adjustable and from which the second control current ($I_2$) flows in substantially two halves through the signal inputs (14, 15) of the current multiplier (13), an associated third control current ($I_3$) is generated which, in dependence upon a second control voltage ($U_2$) is generated, at whose variation the third control current ($I_3$) varies proportionally to the second control current ($I_2$). An associated compensation circuit (2) is provided for each integrator element (1).

10 Claims, 1 Drawing Sheet

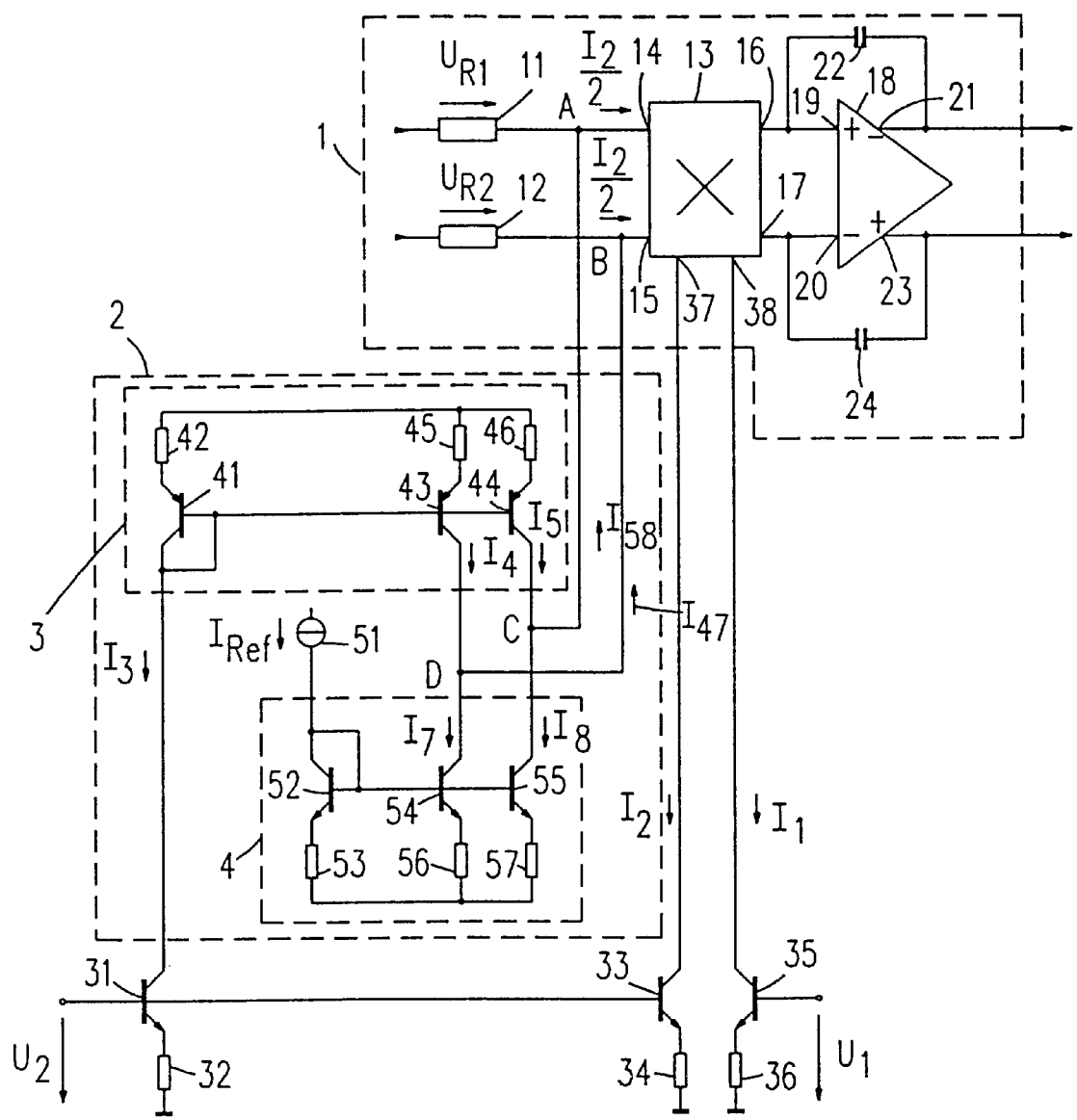

INTEGRATOR-FILTER CIRCUIT

BACKGROUND OF THE INVENTION

1. Field of the Invention

The invention relates to an integrator-filter circuit for filtering a push-pull signal, comprising at least two integrator elements, each of said integrator elements having resistors arranged at its inputs, a subsequent current multiplier having two signal inputs and preceding a push-pull amplifier with an inverting input and a non-inverting input, the inverting output being fed back to the non-inverting input and the non-inverting output being fed back to the inverting input via respective capacitances, the current multiplier receiving, at two control inputs, a first and a second control current by means of which the integration time constant of the integrator element is adjustable and from which the second control current flows in substantially two halves through the signal inputs of the current multiplier.

2. Description of the Related Art

Such integrator-filter circuits are known from, for example, Philips-IC TDA 9715 in which they are used, for example, for chrominance subcarrier filtering in a video signal. Such filters are also known from "Integrated Continuous-Time Filter", Y. P. Tsinidis, J. O. Voorman, IEEE Press, 1992/93.

Such integrator-filter circuits are particularly typical in that their filter frequency is adjustable by means of the first and the second control current. To this end, a plurality of integrator elements are arranged appropriately within the integrator-filter circuit. Each integrator element incorporates a push-pull amplifier which is preceded by a current multiplier, which is also referred to as Gilbert multiplier. The outputs of the push-pull amplifier are fed back to its inputs via capacitances. The current multiplier is preceded by resistors. The control currents are applied to the current multiplier at control inputs. By variation of the control currents, the impedance at the input of the push-pull amplifier can be varied. Consequently the time constant or integration time constant is varied.

The drawback of such integrator-filter circuits, and the integrator elements therein particularly, consists in that the second control current also flows into the inputs of the current multiplier. The control current occurs in substantially two halves at the two inputs. Since this control current thus also flows through the resistors preceding the current multiplier, the control range which the signal to be filtering may have is influenced by the value of the control currents. Accordingly, the control range is reduced at a small control current.

SUMMARY OF THE INVENTION

It is an object of the invention to improve such an integrator-filter circuit in such a way that its control range remains substantially constant independent of the value of the control currents.

According to the invention, this object is solved in that an associated third control current is generated which, in dependence upon a second control voltage, varies proportionally to the second control current, in that an associated compensation circuit is provided for each integrator element, this compensation circuit comprising a first current mirror circuit which generates two substantially equally large equalizing currents in dependence upon the third control current, and a second current mirror circuit which generates two equally large reference control currents in dependence upon a reference current, these reference control currents being superimposed on the equalizing currents for generating two compensation currents, and in that the third control current and the associated compensation circuits are dimensioned in such a way that, in response to the supply of the compensation currents to the signal inputs of the current multiplier of the integrator elements, the sum currents, flowing through the resistors and constituted by half the second control current and compensation current, remain substantially constant when the value of the second control current changes.

According to the invention, the third control current is generated in addition to the two control currents applied to the current multiplier, i.e., in addition to the first and the second control currents. The value of the third control current is proportional to the second control current, i.e., at a variation of the second control current, the third control current varies proportionally.

The third control current is applied to a compensation circuit which comprises a first current mirror circuit generating two substantially equally large equalizing currents in dependence upon the third control current. A second current mirror circuit arranged within the compensation circuit generates two, also substantially equally large reference control currents in dependence upon a reference current. The reference control currents of the second current mirror circuit and the equalizing currents of the first current mirror circuit are superimposed. Compensation currents are then produced which are also substantially equally large and of which a respective one is applied to a signal input of the current multiplier where these compensation currents are superimposed on the portions of the second control current which occur at the inputs of the current multiplier.

The values of the third control current and the compensation circuit are dimensioned in such a way that the superimposition of the compensation currents with the portions of the second control current occurring at the inputs of the multiplier overall effect a constant current flow through the resistors and, hence, a constant control range of the integrator elements. In other words, the compensation currents are implemented in such a way that they compensate any variation of the portions of the second control currents at the inputs of the current multiplier; the compensation currents thus have substantially equal values and inverted signs as the variations of the portions of the second control current at the current multiplier in the case of a variation of the second control voltage. Consequently, the currents flowing in the resistors remain constant, also at a variation of the second control current, because the changed portion of the second control current in the inputs of the current multiplier is compensated by the compensation currents. Since currents of substantially constant value thus always flow through the resistors, independent of the value of the second control current, the control range of the integrator element in this range remains constant as well.

The third control current and the reference current can be generated individually for each integrator element or for each integrator-filter circuit, but may advantageously be generated jointly for a plurality of filter circuits. In dependence upon the possibly jointly generated third control current, however, first and second control currents are generated individually for each integrator element.

The compensation circuit may be implemented in such a way that the compensation currents are zero at a reference integration time constant of the integrator element. This reference integration time constant is preferably chosen to be such that it is situated in a medium range of the possible adjusting range of the integration time constant. No compensation currents flow at this reference integration time constant. If the integration time constant is changed, i.e., if it deviates from the reference integration time constant, the compensation currents also increase with an increasing deviation. As regards value and sign, they are implemented in such a way that a compensation of those portions of the second control current again occurs at the input of the multiplier, which portions occur at said input and deviate from those currents which occur upon adjustment to the reference integration time constant.

This implementation has the advantage that the compensation currents can be maintained relatively small because they are zero in the range of the reference integration time constant and, as variations of the time constant relative to the reference integration time constant cause relatively small variations of the portions of the second control current occur at the signal inputs of the multiplier, these variations can be compensated by relatively small compensation currents.

An advantageous way of generating the first and the second control current characterized in that the first and the second control current are generated by a respective transistor in dependence upon a first and the second control voltage, respectively, the collector currents of the transistors supplying the control currents, and the transistors being coupled to a reference potential, specifically through a respective resistor.

The first and second control currents of the integrator elements may be used both for fine-tuning of the integration time constant and for a coarser tuning of the integration time constants. Particularly, the choice of integration time constants which are relatively wide apart is possible without any problem by virtue of the invention, because the control range of the integrator element remains constant, also at a relatively strong variation of the integration time constants.

An integrator-filter circuit of the type according to the invention can be implemented for versatile uses because, particularly, the choice of integration time constants and hence, the filter frequencies of the overall filter arrangement is free, or these frequencies of the desired filter frequencies can be easily adapted without any drawbacks as regards their control range.

For filtering one or more sound carriers in a video signal, filter arrangements, including two or more integrator-filter circuits, may be used advantageously for filtering, in which a plurality of integrator-filter circuits are successively arranged and are each tuned to different frequencies. On the one hand, it can thereby be achieved that several carrier frequencies are filtered. On the other hand, carriers having a relatively large amplitude can be attenuated by means of, for example, two integrator-filter circuits to a stronger extent than other carriers which have a smaller amplitude and are attenuated by means of, for example, one integrator-filter circuit. As a result, it can be achieved that, after filtering, the carriers which originally have differently large amplitudes are attenuated at a substantially equal value.

BRIEF DESCRIPTION OF THE DRAWING

The sole FIGURE of the drawing is a block diagram of an integrator element 1 and associated compensation circuit circuits for generating control currents.

DESCRIPTION OF THE PREFERRED EMBODIMENTS

A filter arrangement accommodates a plurality of such integrator elements with the associated elements, particularly an associated compensation circuit. The number of filter elements used defines the order of the filter circuit.

Such an integrator-filter circuit may be used, for example, for filtering a sound carrier in a video signal. To filter a plurality of sound carriers of different frequencies, a plurality of integrator-filter circuits may be connected in series.

The integrator element 1 shown in the FIGURE receives a push-pull signal which may be, for example, a balanced video signal comprising sound carriers.

The balanced or push-pull signal is applied to resistors 11 and 12 within the integrator element 1. The resistors 11 and 12 precede signal inputs 14 and 15 of a current multiplier 13 which is also referred to as Gilbert multiplier. A push-pull signal which is applied to a non-inverting input 19 and to an inverting input 20 of a push-pull amplifier 18 is present again at the outputs 16 and 17 of the current multiplier 13.

The amplified signal of the input 19 occurs at an inverting output 21 of the push-pull amplifier 18. This signal is a signal component of the push-pull signal at the output of the integrator element 1 and is fed back to the non-inverting input 19 via a capacitance 22.

In a corresponding manner, a non-inverting output 23 supplies the amplified input signal from the inverted input 20, this signal also representing a component of the output push-pull signal of the integrator element 1 and being fed back to the inverting input 20 via a capacitance 24.

The control of the integration time constant of the integrator element 1 is adjustable by means of a first control current $I_1$ and a second control current $I_2$. The relation $t = R \cdot C \cdot I_2/I_1$ holds for the integration time constant. In this equation, R represents the resistors 11 and 12 and C represents the capacitances 22 and 24. Thus, tuning of the integration time constant of the integrator element 1 is possible without varying the resistors or capacitances.

The relation for the two control currents $I_1$ and $I_2$ may be used for adjusting these time constants.

However, this has the drawback that the control current $I_2$ flows in approximately two halves also at the inputs 14 and 15 of the current multiplier 13. Consequently, it also flows with an unchanged value in the resistors 11 and 12 via prior-art arrangements. When the control current $I_2$ is varied in value for adjusting the integration frequency, particularly when it is reduced, a correspondingly reduced, halved control current also occurs in the resistors 11 and 12. As a result, the possible control range of the integrator element 1 is reduced accordingly. The control range of the integrator element 1 is thus dependent on the second control current and, therefore, also dependent on the adjusted integration time constant. This is an unwanted effect which is to be eliminated by the integrator-filter circuit according to the invention. This is effected by suitably generating two compensation currents $I_{47}$ and $I_{58}$ which are applied to the junction points between the resistors 11 and 12 and the inputs 14 and 15 of the current multiplier 13 and compensate variations of the portions of the second control current occurring at the inputs 14 and 15 of the current multiplier 13.

To this end, a third control current $I_3$ is generated which, in the case of variation of the second control current $I_2$, varies proportionally to this current.

In the embodiment shown in the FIGURE, this is achieved in that both the second control current $I_2$ and the third control current $I_3$ are generated in dependence upon a second control voltage $U_2$. The second control voltage $U_2$ is applied to bases of two transistors 31 and 33 whose emitters are connected to a reference potential via resistors 32 and 34, respectively. In dependence upon the second control voltage $U_2$, the third control current $I_3$ then flows through the collector of the transistor 31 and the second control current $I_2$ flows through the collector of the transistor 33. Due to the common dependence on the second control voltage $U_2$, the two control currents $I_2$ and $I_3$ relate proportionally to each other.

In a corresponding manner, the first control current $I_1$ can advantageously be generated in dependence upon a first control voltage $U_1$ by means of a similarly arranged transistor 35 and a resistor 36.

The integrator-filter circuit according to the invention comprises a compensation circuit 2 which receives the third control current and itself comprises a first current mirror circuit 3 and a second current mirror circuit 4.

The input of the first current mirror circuit 3 receives the control current $I_3$ which is mirrored with respect to two substantially equally large equalizing currents $I_4$ and $I_5$. This is effected in known manner by means of a current mirror circuit which comprises three PNP transistors 41, 43 and 44, whose emitters are coupled together via resistors 42, 45 and 46 and whose bases are also coupled together. The collector and base of the transistor 41 are coupled together and constitute the input of the current mirror circuit. The collectors of the transistors 43 and 44 constitute the outputs of the current mirror circuit and supply the equalizing currents $I_4$ and $I_5$.

The input of the second current mirror circuit 4 receives a reference current $I_{ref}$ generated by a generator 51. This reference current is constant. The second current mirror circuit 4 consists of transistors 52, 54 and 55 and resistors 53, 56 and 57, similarly as the first current mirror circuit 3 but, unlike this circuit, it is built up with NPN transistors.

The collectors of the transistors 54 and 55 supply reference control 7 currents $I_7$ and $I_8$ which have substantially equal values and are constant because the input current $I_{ref}$ of the current mirror circuit 4 is also constant.

The equalizing currents $I_4$ and $I_5$, which are supplied by the first current mirror circuit 3, and the reference control currents $I_7$ and $I_8$, which are supplied by the second current mirror circuit 4, are combined at nodes C and D. The equalizing current $I_4$ is superimposed on the reference current $I_7$ and the equalizing current $I_5$ is superimposed on the reference control current $I_8$.

Due to this superimposition at the nodes C and D, the compensation currents $I_{47}$ and $I_{58}$ are generated which are applied to the nodes B and A between the inputs 14 and 15 of the multiplier and the resistors 11 and 12, respectively.

The compensation circuit 2 operates as follows.

To adjust the integration time constant of the integrator element, the second control voltage $U_2$ is varied. Consequently, the second control current $I_2$ is varied, this second control current being applied to the current multiplier 13 and changing the impedance which is effective at the input of the push-pull amplifier 18.

An integrator-filter circuit comprises a plurality of integrator elements 1 in a manner which is not shown in the FIGURE. These integrator elements are arranged in known manner; their number defines the order of the overall integrator-filter circuit. All circuit elements shown in the FIGURE in addition to the integrator element 1, particularly, the compensation circuit 2, can be individually provided for each integrator element 1 of an integrator-filter circuit. The filter frequency of the overall integrator-filter arrangement can be adjusted by choosing the integration time constants of the integrator elements 1. The elements 31, 32, 41, 42, 51, 52 and 53 may be arranged once for one or more integrator-filter circuits.

The drawback occurring in prior-art arrangements is that, in the case of a variation of the second control current $I_2$ for adjusting the integration time constant, this varied control current $I_2$ also flows in the inputs 14 and 15 where it flows in approximately two halves. This is denoted in the FIGURE by means of the arrows $I_2/2$ at the two inputs 14 and 15 of the current multiplier 13. This situation particularly has the drawback that, in the case of a variation of the control current $I_2$, these currents, which also flow through the resistors 11 and 12, change the control range. At a reduction of the second control current $I_2$, smaller currents $I_2/2$ also flow through the resistors 11 and 12, so that the control range of the integrator element is reduced in this range. This is an unwanted effect.

By supplying the compensation currents $I_{47}$ and $I_{58}$ at the nodes A and B, this unwanted variation of the currents $I_2/2$ is compensated so that, independent of the current $I_2$ or the currents $I_2/2$, a constant current flows in the resistors 11 and 12.

This is achieved by means of the following measures.

The third control current $I_3$, which is generated in proportional dependence upon control current $I_2$, is applied to the first current mirror circuit 3 which supplies the equalizing currents $I_4$, and $I_5$ which are thus also proportional to the control current $I_2$ and thus also to the halved control current $I_2/2$ at the inputs 14 and 15 of the current multiplier 13. The compensation currents $I_{47}$ and $I_{58}$ are generated by subtracting a constant current $I_7$ and $I_8$ from the equalizing currents $I_4$ and $I_5$. The compensation currents $I_{47}$ and $I_{58}$ supply a current at the nodes A and B, whose value corresponds to those changed current portions at the inputs 14 and 15 of the current multiplier 13 which occur due to a variation of the second control current $I_2$. For example, if the second control current $I_2$ is increased by a given extent, the currents $I_2/2$ in the inputs 14 and 15 of the current multiplier 13 also increase proportionally thereto by half the value. It is exactly this variation of the currents $I_2/2$ in the inputs of the multipliers 14 and 15 which is compensated by the compensation currents $I_{47}$ and $I_{58}$, i.e. these currents have the same value as the extent of the variation of the currents $I_2/2$. Consequently, apart from influences of a possibly supplied signal to be filtered, constant currents flow in the resistors 11 and 12. At a change of the control current $I_2$ in this range, a constant control range is thereby realized.

The compensation circuit 2 may be implemented advantageously in such a way that the currents $I_4$ and $I_5$ have the same value as the currents $I_7$ and $I_8$ at a reference integration time constant. At this reference integration time constant, the compensation currents $I_{47}$ and $I_{58}$ have the value of zero. Thus, at the reference integration time constant, the unchanged current $I_2/2$ also flows through the resistors 11 and 12.

When the second control current $I_2$ is changed so as to adjust a changed integration time constant, the control current portions $I_2/2$ in the inputs 14 and 15 of the current multiplier 13 will also be increased, for example, when the current $I_2$ is increased, which control current portions increase to substantially half this extent as compared with the increase of the control current $I_2$. Without compensation, correspondingly increased currents would flow in the resistors 11 and 12. However, the compensation circuit 2 is implemented in such a way that the compensation currents $I_{47}$ and $I_{58}$ exactly compensate this changed portion in the currents $I_2/2$, i.e. the compensation currents supply a current which is exactly as large as the change of the currents $I_2/2$ with respect to the reference integration time constant.

Advantageously, this reference integration time constant may be chosen to be such that it is situated in a medium range of the selection range of the integration time constant. It is thereby achieved that a minimum value of the compensation currents $I_{47}$ and $I_{58}$ is required.

In an integrator-filter circuit comprising a plurality of integrator elements 1, the compensation currents can be individually generated, or are provided for each integrator element 1 by means of a compensation circuit 2. Thus, for each integrator element 1, a compensation of the variation of the control current portions at the inputs of the multipliers is effected individually. The third control current and the reference current can, however, be jointly generated only once for a plurality of filter elements or a plurality of integrator-filter circuits.

What is claimed is:

1. An integrator-filter circuit for filtering a push-pull signal, comprising at least two integrator elements, each of said integrator elements comprising:

two inputs;

two resistors arranged, respectively, at said two inputs;

a current multiplier having two signal inputs coupled to said resistors, respectively; and a push-pull amplifier having an inverting input and a non-inverting input coupled to respective outputs of said current multiplier, said push-pull amplifier having an inverting output fed back to the non-inverting input and a non-inverting output fed back to the inverting input via respective capacitances, the current multiplier having two control inputs for receiving a first and a second control current for adjusting an integration time constant of the integrator element, the second control current flowing, in substantially two halves, through the signal inputs of the current multiplier, characterized in that said integrator-filter circuit further comprises means for generating a third control current ($I_3$) which varies proportionally to the second control current ($I_2$); and a respective compensation circuit associated with each integrator element, each of said compensation circuits comprising:

a first current mirror circuit for generating two substantially equal equalizing currents in dependence upon the third control current ($I_3$); and a second current mirror circuit for generating two equal reference control currents in dependence upon a reference current, means for superimposing said two reference control currents on the two equalizing currents for forming two compensation currents, said two compensation currents being applied to the signal inputs of the current multiplier in the associated integrator element, and means for dimensioning each third control current and each compensation circuit such that sum currents, flowing through the resistors and including half the second control current and the compensation currents, remain substantially constant when the value of the second control current changes.

2. An integrator-filter circuit as claimed in claim 1, characterized in that the compensation circuit is implemented such that the compensation currents are zero at a reference integration time constant, and in that the compensation currents assume increasingly larger values with an increasing deviation from the reference integration time constant when an integrator element is tuned to an integration time constant which deviates from the reference integration time constant, so that, at the signal inputs of the current multiplier, those parts of the second control current are compensated which occur at said inputs and deviate from the portions of the second control current occurring at said inputs when tuning to the reference integration time constant.

3. An integrator-filter circuit as claimed in claim 1, characterized in that the first and the second control currents are generated by respective transistors in dependence upon a first and a second control voltage, respectively, collectors of the transistors supplying the first and second control currents, and the transistors being coupled to a reference potential through respective resistors.

4. An integrator-filter circuit as claimed in claim 1, characterized in that the first and second control currents of the integrator elements are used both for selecting the filter frequency of the integrator-filter circuit and for fine-tuning the filter frequency of the integrator-filter circuit.

5. An integrator-filter circuit as claimed in claim 1, characterized in that the integrator elements are implemented for filtering a sound carrier of a video signal applied to the integrator-filter circuit, and in that the filter frequency of the integrator-filter circuit is adjustable to the sound carrier frequency by means of the first and second control currents of the integrator elements.

6. An integrator-filter circuit as claimed in claim 1, characterized in that the integrator elements are implemented for filtering a chrominance subcarrier of a video signal applied to the integrator-filter circuit, and in that the filter frequency of the integrator-filter circuit is adjustable to the chrominance subcarrier frequency by means of the first and second control currents of the integrator elements.

7. A filter arrangement including a plurality of integrator-filter circuits for filtering a push-pull signal, comprising at least two integrator elements, each of said integrator elements comprising:

two inputs;

two resistors arranged, respectively, at said two inputs;

a current multiplier having two signal inputs coupled to said resistors, respectively; and a push-pull amplifier having an inverting input and a non-inverting input coupled to respective outputs of said current multiplier, said push-pull amplifier having an inverting output fed back to the non-inverting input and a non-inverting output fed back to the inverting input via respective capacitances, the current multiplier having two control inputs for receiving a first and a second control current for adjusting an integration time constant of the integrator element, the second control current flowing, in substantially two halves, through the signal inputs of the current multiplier, characterized in that said integrator-filter circuit further comprises means for generating a third control current ($I_3$) which varies proportionally to the second control current ($I_2$); and a respective compensation circuit associated with each integrator element, each of said compensation circuits comprising:

a first current mirror circuit for generating two substantially equal large equalizing currents in dependence upon the third control current ($I_3$); and a second current mirror circuit for generating two equal reference control currents in dependence upon a reference control currents on the two equalizing currents for forming two compensation currents, said two compensation currents being applied to the signal inputs of the current multiplier in the associated integrator element, and means for dimensioning each third control current and each compensation circuit such that sum currents, flowing through the resistors and including half the second control current and the compensation currents, remain substantially constant when the value of the second control current changes.

8. A filter arrangement including at least two integrator-filter circuits as claimed in claim 7, characterized in that said third control current and/or said reference current is generated commonly for a plurality of integrator-filter circuits.

9. A filter arrangement including at least two integrator-filter circuits as claimed in claim 7, characterized in that the filter arrangement is implemented for filtering a stereo or two-tone signal modulated on two sound carriers of a video signal applied to the integrator-filter circuit, a first integrator-filter circuit being implemented for filtering a first sound carrier and a second integrator-filter circuit being implemented for filtering a second sound carrier.

10. A filter arrangement including three integrator-filter circuits as claimed in claim 7, characterized in that the filter arrangement is implemented for filtering a stereo or two-tone signal modulated on two sound carriers of a video signal applied to the integrator-filter circuit, first and second integrator-filter circuits for filtering a first sound carrier and having mutually offset filter frequencies, and a third integrator-filter circuit being implemented for filtering a second sound carrier.

* * * * *